United States Patent
Wakazono

(10) Patent No.: US 11,705,806 B2
(45) Date of Patent: Jul. 18, 2023

(54) CONTROL DEVICE

(71) Applicants: AutoNetworks Technologies, Ltd., Yokkaichi (JP); Sumitomo Wiring Systems, Ltd., Yokkaichi (JP); Sumitomo Electric Industries, Ltd., Osaka (JP)

(72) Inventor: Keisuke Wakazono, Yokkaichi (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 17/605,544

(22) PCT Filed: Apr. 6, 2020

(86) PCT No.: PCT/JP2020/015560
§ 371 (c)(1),
(2) Date: Oct. 21, 2021

(87) PCT Pub. No.: WO2020/217958
PCT Pub. Date: Oct. 29, 2020

(65) Prior Publication Data
US 2022/0170437 A1    Jun. 2, 2022

(30) Foreign Application Priority Data
Apr. 26, 2019   (JP) ................................. 2019-085996

(51) Int. Cl.
*H02M 1/36* (2007.01)
*F02N 11/04* (2006.01)
*F02N 11/08* (2006.01)

(52) U.S. Cl.
CPC .............. *H02M 1/36* (2013.01); *F02N 11/04* (2013.01); *F02N 11/087* (2013.01);
(Continued)

(58) Field of Classification Search
CPC ...... H02M 1/36; F02N 11/04; F02N 11/0866; F02N 11/087; F02N 2011/0885;
(Continued)

(56) References Cited

U.S. PATENT DOCUMENTS

2015/0029767 A1\* 1/2015 Chou .................... H02M 3/003
363/49
2017/0279443 A1   9/2017 Morimoto
(Continued)

FOREIGN PATENT DOCUMENTS

JP    2005-39385 A    2/2005
JP    2015-100240 A   5/2015
(Continued)

OTHER PUBLICATIONS

International Search Report, Application No. PCT/JP2020/015560, dated Jun. 23, 2020. ISA/Japan Patent Office.

*Primary Examiner* — Joseph J Dallo
(74) *Attorney, Agent, or Firm* — Honigman LLP

(57) ABSTRACT

A control device for a vehicle includes a semiconductor switch, and opens and closes a connection between a capacitor connected to one end of the semiconductor switch and an on-board battery connected to another end of the semiconductor switch by turning ON/OFF the semiconductor switch. The control device includes: a wiring for applying a drive voltage for turning ON the semiconductor switch; a drive switch for short-circuiting the wiring to turn OFF the semiconductor switch; a Zener diode having an anode connected to the one end of the switching circuit, and a cathode connected to the wiring; a voltage detection unit detects a voltage at the one end of the switching circuit; and a control unit that controls the drive switch from OFF to ON, and determines whether or not the semiconductor switch is defective by comparing the voltage detected by the voltage detection unit with a threshold value.

7 Claims, 9 Drawing Sheets

(52) U.S. Cl.
    CPC .. *F02N 11/0866* (2013.01); *F02N 2011/0885* (2013.01); *F02N 2200/06* (2013.01); *F02N 2300/10* (2013.01)

(58) Field of Classification Search
    CPC ... F02N 2200/06; F02N 2300/10; H02H 3/04; H03K 17/0822
    See application file for complete search history.

(56) References Cited

U.S. PATENT DOCUMENTS

| | | | |
|---|---|---|---|
| 2018/0205310 A1* | 7/2018 | Feng | H02M 1/32 |
| 2020/0044648 A1* | 2/2020 | Sharma | H03K 17/063 |
| 2020/0076199 A1* | 3/2020 | Kaufman | H02J 7/04 |
| 2020/0194993 A1* | 6/2020 | Dickey | H02H 3/05 |
| 2020/0259407 A1* | 8/2020 | Ye | H02H 9/025 |
| 2021/0143811 A1* | 5/2021 | Namuduri | H03K 17/0822 |
| 2021/0320489 A1* | 10/2021 | Ferguson | H02H 3/20 |
| 2021/0351770 A1* | 11/2021 | Liu | H02H 1/0007 |

FOREIGN PATENT DOCUMENTS

| | | | | |
|---|---|---|---|---|
| WO | WO-2015053206 A1 * | 4/2015 | | H03K 17/0822 |
| WO | WO-2016060541 A1 * | 4/2016 | | G05F 1/571 |
| WO | WO-2017075111 A1 * | 5/2017 | | G05F 3/24 |
| WO | WO-2017079134 A1 * | 5/2017 | | H01H 83/00 |
| WO | WO-2018081619 A2 * | 5/2018 | | G01R 19/2513 |
| WO | WO-2018162133 A1 * | 9/2018 | | H01H 9/30 |
| WO | WO-2019149104 A1 * | 8/2019 | | H02M 1/32 |
| WO | WO-2020098372 A1 * | 5/2020 | | H02M 5/458 |
| WO | WO-2021024813 A1 * | 2/2021 | | H01L 27/0255 |

\* cited by examiner

CONTROL DEVICE

CROSS-REFERENCE TO RELATED APPLICATIONS

This application is the U.S. national stage of PCT/JP2020/015560 filed on Apr. 6, 2020, which claims priority of Japanese Patent Application No. JP 2019-085996 filed on Apr. 26, 2019, the contents of which are incorporated herein.

TECHNICAL FIELD

The present disclosure relates to a control device.

BACKGROUND

JP 2005-39385A discloses a control device for a vehicle including a switching circuit including a semiconductor switch that controls a large current supplied to a load, the semiconductor switch being provided with a defect diagnosis unit. The defect diagnosis unit determines whether or not the semiconductor switch has an operation defect by determining consistency between an ON/OFF control signal input to the semiconductor switch and an output level of the semiconductor switch.

In the control device for a vehicle according to JP 2005-39385A, in a case where a capacitor connected to a circuit of an on-board device whose opening and closing is controlled, if the capacitance of the capacitor is large, there is a technical problem that it takes time to discharge the capacitor and it takes time to diagnose a defect of the switching circuit.

In a case where a configuration is employed in which a switch circuit opens and closes a connection between a starter having a capacitor and an on-board battery with a switching circuit, for example, even if the switching circuit in an open state is turned OFF, it takes time until the capacitor is discharged and the voltage decreases. Accordingly, it takes time to diagnose whether or not the switching circuit is operating normally.

SUMMARY

An object of the present disclosure is to provide a control device capable of determining whether or not a switching circuit is defective in a short time by efficiently discharging a capacitor of an on-board device whose opening and closing is controlled when the capacitor is connected.

A control device according to this aspect is a control device for a vehicle, including a switching circuit having a semiconductor switch, and being configured to open and close a connection between an on-board device having a capacitor connected to one end of the switching circuit and an on-board battery connected to another end of the switching circuit by turning ON/OFF the switching circuit, the control device further including: a wiring for applying a drive voltage for turning ON the semiconductor switch to a gate of the semiconductor switch; a drive switch for short-circuiting the wiring to turn OFF the semiconductor switch; a Zener diode having an anode connected to the one end of the switching circuit, and a cathode connected to the wiring; a voltage detection unit configured to detect a voltage at the one end of the switching circuit; and a control unit configured to control the drive switch from OFF to ON, and determine whether or not the switching circuit is defective by comparing the voltage detected by the voltage detection unit with a predetermined threshold value.

Note, that the present application can be achieved not only as a control unit including such a characteristic processing unit, but also as a control method including such characteristic processing as steps, as described above, or as a program for causing a computer to execute such steps. In addition, the present application can be achieved as a semiconductor integrated circuit that realizes a part or all of the control device, or can be achieved as another system including the control device.

Effects of the Present Disclosure

The present disclosure can provide a control device capable of determining whether or not a switching circuit is defective in a short time by efficiently discharging a capacitor of an on-board device whose opening and closing is controlled when the capacitor is connected.

DETAILED DESCRIPTION OF PREFERRED EMBODIMENTS

Figure 1:
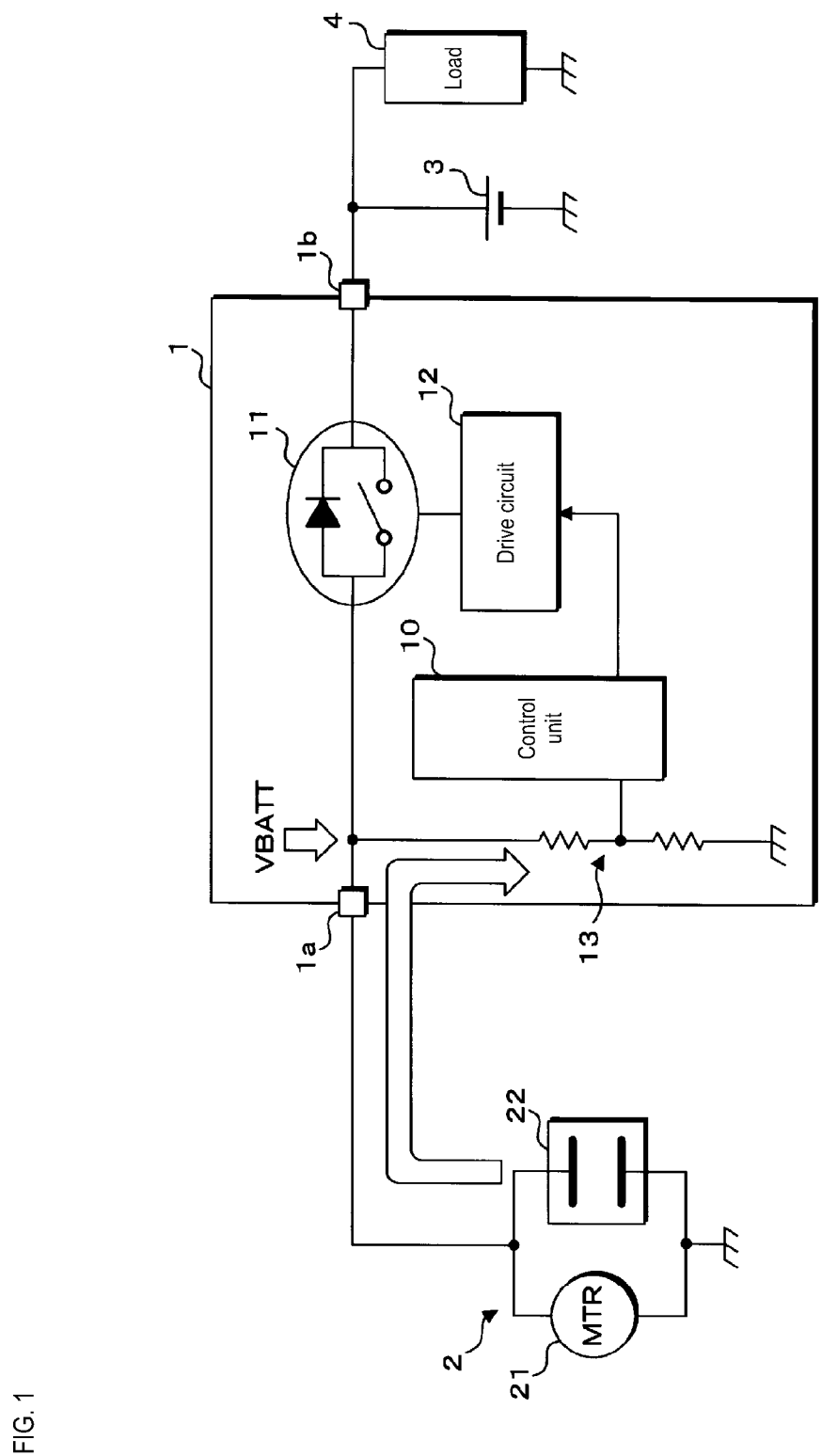
FIG. 1 is a circuit block diagram illustrating a configuration example of a current control system for a vehicle according to a first embodiment.

First, embodiments of the present disclosure will be listed and described. In addition, at least some of the embodiments described below may also be combined as desired.

A control device according to this aspect is a control device for a vehicle, including a switching circuit having a semiconductor switch, and being configured to open and close a connection between an on-board device having a capacitor connected to one end of the switching circuit and an on-board battery connected to another end of the switching circuit by turning ON/OFF the switching circuit, the control device further including: a wiring for applying a drive voltage for turning ON the semiconductor switch to a gate of the semiconductor switch; a drive switch for short-circuiting the wiring to turn OFF the semiconductor switch; a Zener diode having an anode connected to the one end of the switching circuit, and a cathode connected to the wiring; a voltage detection unit configured to detect a voltage at the one end of the switching circuit; and a control unit configured to control the drive switch from OFF to ON, and determine whether or not the switching circuit is defective by comparing the voltage detected by the voltage detection unit with a predetermined threshold value.

According to this aspect, the control unit can determine whether or not the switching circuit is defective in a time that is shorter than a time required to completely discharge the capacitor charged by the on-board battery.

When determining whether or not the switching circuit is defective, the control unit controls the drive switch from OFF to ON. When the drive switch is OFF, the semiconductor switch is ON (see FIG. 3). When the drive switch is ON, the semiconductor switch is OFF (see FIG. 4). When the switching circuit is ON, the capacitor and the on-board battery are connected to each other, and the capacitor is in a charged state. When the switching circuit is normally turned OFF by the control of the drive switch, the capacitor is disconnected from the on-board battery, and the capacitor starts discharging (see FIG. 4).

When the capacitor is discharged and the voltage at the one end of the switching circuit decreases to the reference potential, it can be determined that the switching circuit is normally controlled from ON to OFF.

In particular, according to this aspect, the electric charge accumulated in the capacitor is discharged through the Zener diode, the wiring, and the drive switch. Accordingly, the capacitor can be discharged in a shorter time than in a case where the capacitor is naturally discharged. As a result, the control unit can determine in a short time whether or not the switching circuit is defective.

Further, in this aspect, the wiring constituting the drive circuit of the semiconductor switch, the Zener diode for protecting the semiconductor switch, and the drive switch for driving the semiconductor switch are also used as a discharge circuit. In other words, the drive circuit also has a function of discharging the capacitor. Accordingly, the control device according to this aspect can efficiently discharge the capacitor while suppressing an increase in the number of components, and can determine in a short time whether or not the switching circuit is defective.

Further, the control for controlling the drive switch from OFF to ON is not only the control for switching the semiconductor switch from ON to OFF, but also the control for starting the discharge of the capacitor. Therefore, the control circuit can control the semiconductor switch and discharge of the capacitor simply by controlling the drive switch.

It is preferable that the voltage detection unit includes voltage dividing resistors that divide a voltage at the one end of the switching circuit.

According to this aspect, when the switching circuit is normally turned OFF, the capacitor is disconnected from the on-board battery, and the electric charge accumulated in the capacitor is further discharged through the voltage dividing resistors provided for voltage detection. Accordingly, the capacitor can be discharged in a shorter time. As a result, the control unit can determine in a short time whether or not the switching circuit is defective.

It is preferable that the control device includes a discharge switch for grounding the one end of the switching circuit, and the control unit controls the drive switch and the discharge switch from OFF to ON.

According to this aspect, when the switching circuit is normally turned OFF, the capacitor is disconnected from the on-board battery, and the electric charge accumulated in the capacitor is further discharged through the discharge switch. Accordingly, the capacitor can be discharged in a shorter time. As a result, the control unit can determine in a short time whether or not the switching circuit is defective.

It is preferable that the control device includes an electric resistor in the wiring.

According to this aspect, the surge voltage applied from the outside to the control unit and the surge current flowing from the outside to the control unit can be reduced by the electric resistor.

It is preferable that the switching circuit includes a plurality of the semiconductor switches connected in parallel, and the control device includes a plurality of the Zener diodes and a plurality of the electric resistors respectively provided in the plurality of semiconductor switches.

According to this aspect, the switching circuit includes the plurality of semiconductor switches connected in parallel. Accordingly, the control device can open and close a circuit through which a large current that cannot be controlled by one semiconductor switch flows.

Each of the plurality of semiconductor switches is provided with the Zener diode. The electric charge accumulated in the capacitor is discharged through the plurality of Zener diodes, the wirings, and the drive switches. Accordingly, the capacitor can be discharged in a shorter time. As a result, the control unit can determine in a short time whether or not the switching circuit is defective.

Each of the plurality of semiconductor switches is provided with the electric resistor. Accordingly, it is possible to more effectively reduce a surge voltage applied from the outside to the control unit and a surge current flowing from the outside to the control unit. The electric resistor provided in each semiconductor switch can be miniaturized.

A control device according to embodiments of the present disclosure will be described below with reference to the drawings. Note, that the present disclosure is not limited to these examples, but is defined by the scope of the claims, and is intended to include all modifications within the meaning and scope equivalent to the scope of the claims.

Hereinafter, the present disclosure will be described in detail with reference to drawings showing embodiments thereof.

First Embodiment

FIG. 1 is a circuit block diagram illustrating a configuration example of a current control system for a vehicle according to a first embodiment. The current control system for a vehicle according to the first embodiment includes a control device 1 for a vehicle, a starter generator (an on-board device) 2, and on-board battery 3, and a load 4. The control device 1 includes a control unit 10, a switching circuit 11, a drive circuit 12, and a voltage detection unit 13. A first terminal 1a is connected to one end of the switching circuit 11, and a second terminal 1b is connected to the other end of the switching circuit 11. The first terminal 1a is connected to one end of the starter generator 2, and the other end of the starter generator 2 is grounded. The starter generator 2 has a generation function in addition to a starter function for starting the engine of the vehicle, and includes a motor 21 for starting the engine and a capacitor 22. One end of the capacitor 22 is connected to the first terminal 1a, and the other end of the capacitor 22 is grounded. The positive electrode of the on-board battery 3 is connected to the second terminal 1b, and the negative electrode of the on-board battery 3 is grounded. One end of the load 4 is connected to the second terminal 1b, and the other end of the load 4 is grounded. The load 4 is an on-board device such as a vehicle interior light, an air conditioner, or a car navigation device.

In the current control system for a vehicle configured as described above, the starter generator 2 is connected via the control device 1 to the on-board battery 3 and the load 4. The control device 1 opens and closes a connection between the starter generator 2 and the on-board battery 3.

When the engine of the vehicle is operating and the starter generator 2 is generating power, the starter generator 2 including the capacitor 22 is connected to the on-board battery 3. The on-board battery 3 and the capacitor 22 are charged by power generation of the starter generator 2. Even when the starter generator 2 is not generating power, the capacitor 22 is charged by the on-board battery 3 if the capacitor 22 and the on-board battery 3 are connected.

When the engine of the vehicle is stopped, the control device 1 opens the circuit, and disconnects the starter generator 2 from the on-board battery 3. When the engine is started in this state, the motor 21 is driven by a starter battery (not shown) connected to the starter generator 2 to start the engine. A large amount of electric power is required to drive the motor 21. However, because the starter generator 2 is disconnected from the on-board battery 3 and the load 4, it is possible to avoid problems such as a voltage drop on the load 4 side. When the engine is started, the control device 1 closes the circuit, and the starter generator 2 and the on-board battery 3 are connected.

Figure 2:
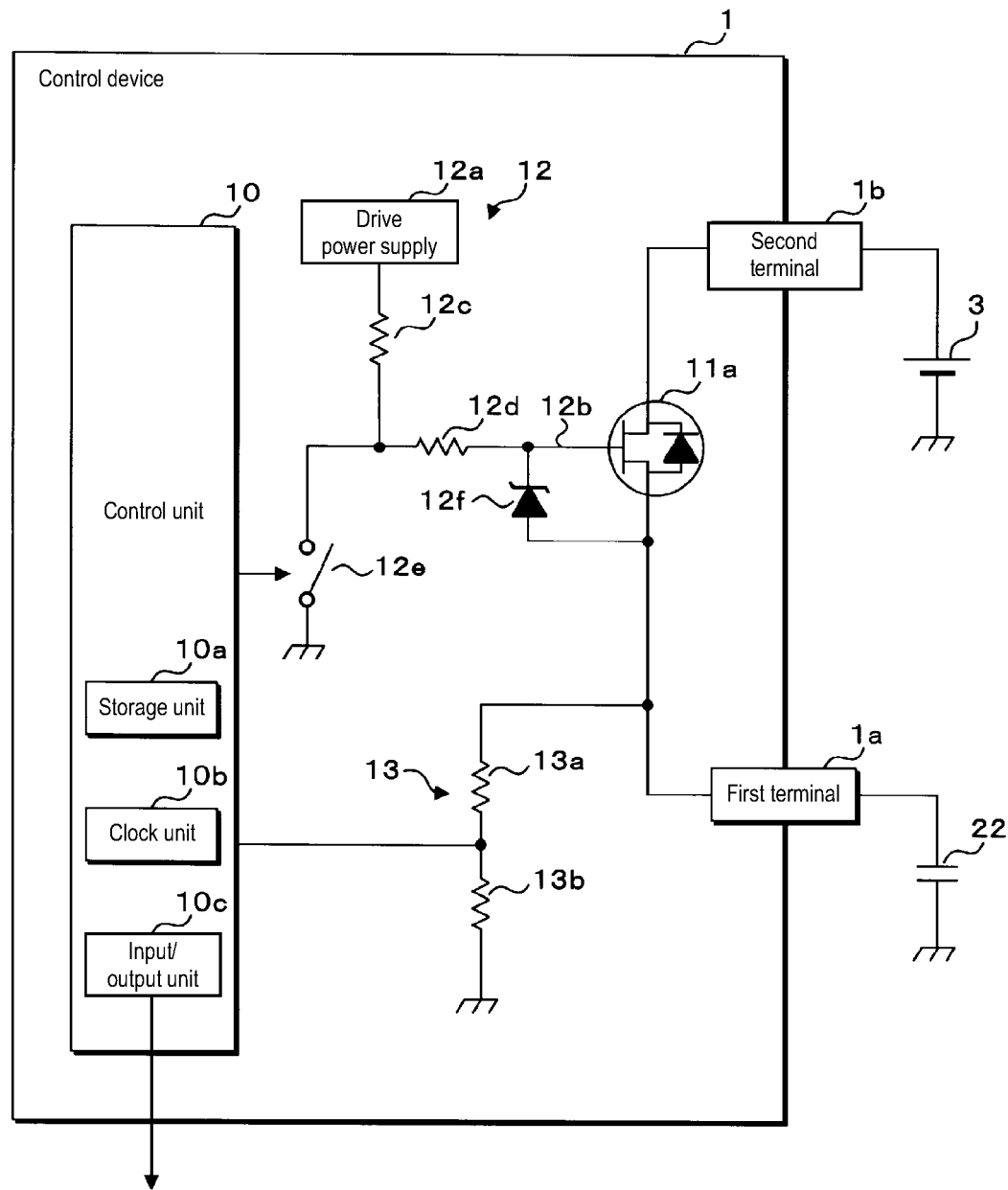
FIG. 2 is a block diagram illustrating a configuration example of a control device according to the first embodiment.

FIG. 2 is a block diagram illustrating a configuration example of the control device 1 according to the first embodiment. The switching circuit 11 includes at least one semiconductor switch 11a. As the semiconductor switch 11a, for example, a metal-oxide-semiconductor field-effect transistor (MOSFET), an insulated gate bipolar transistor (IGBT), or the like may be used. In the following description, it is assumed that the semiconductor switch 11a is an N-channel MOSFET. The semiconductor switch 11a has a drain connected to the second terminal 1b, and a source connected to the first terminal 1a.

The drive circuit 12 is a circuit for turning ON/OFF the semiconductor switch 11a, and the operation of the drive circuit 12 is controlled by the control unit 10. The drive circuit 12 includes a drive power supply 12a, a wiring 12b, a first electric resistor 12c, a second electric resistor 12d, a drive switch 12e, and a Zener diode 12f.

The drive power supply 12a outputs a drive voltage for turning ON/OFF the semiconductor switch 11a. The drive power supply 12a is connected, via the wiring 12b, and the first electric resistor 12c and the second electric resistor 12d connected in series, to the gate of the semiconductor switch 11a. The wiring 12b is a conductive line for connecting the drive power supply 12a and the gate of the semiconductor switch 11a. Specifically, one end of the first electric resistor 12c is connected to the positive electrode terminal of the drive power supply 12a through the wiring 12b, and the other end of the first electric resistor 12c is connected to one end of the second electric resistor 12d. The other end of the second electric resistor 12d is connected to the gate of the semiconductor switch 11a through the wiring 12b. The second electric resistor 12d is, for example, an anti-surge electric resistor.

The drive switch 12e is a switch for turning ON/OFF the semiconductor switch 11a. The drive switch 12e is, for example, a transistor switch. One end of the drive switch 12e is grounded, and the other end of the drive switch 12e is connected to the other end of the first electric resistor 12c and one end of the second electric resistor 12d through the wiring 12b.

When a low-level signal is output from the control unit 10 to the drive switch 12e, the drive switch 12e is turned OFF. When the drive switch 12e is OFF, the drive voltage of the drive power supply 12a is applied to the gate of the semiconductor switch 11a through the wiring 12b, and the semiconductor switch 11a is turned ON (see FIG. 3).

When a high-level signal is output from the control unit 10 to the drive switch 12e, the drive switch 12e is turned ON. When the drive switch 12e is ON, the gate of the semiconductor switch 11a is grounded and the semiconductor switch 11a is turned OFF (see FIG. 4).

The control unit 10 is a computer including a CPU (not shown), a storage unit 10a, a clock unit 10b, and an input/output unit 10c, and the like. The storage unit 10a stores information for determining whether or not the semiconductor switch 11a is defective. In addition, the storage unit 10a stores a defect diagnosis result of the semiconductor switch 11a. The input/output unit 10c externally outputs a signal or data indicating a defect of the semiconductor switch 11a or whether or not the semiconductor switch 11a is defective.

The voltage detection unit 13 includes voltage dividing resistors 13a and 13b connected in series. One end of the series circuit is connected to a first terminal 1a, and the other end of the series circuit is grounded. The control unit 10 can detect the first terminal 1a, that is to say, the voltage at the first terminal 1a of the switching circuit 11 by obtaining the voltage divided by the voltage dividing resistors 13a and 13b.

Figure 3:
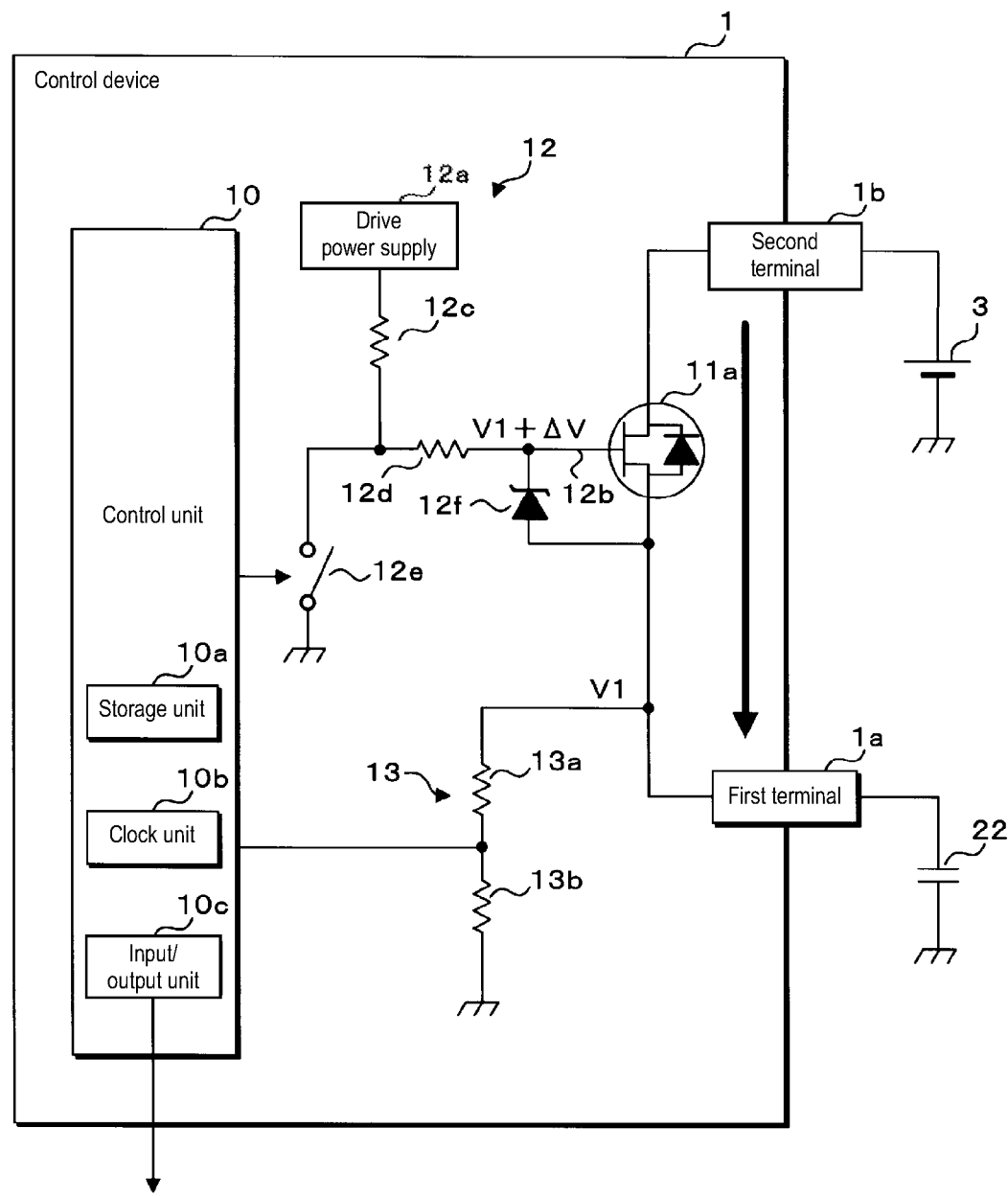
FIG. 3 is a diagram illustrating how a defect is determined.
Figure 4:
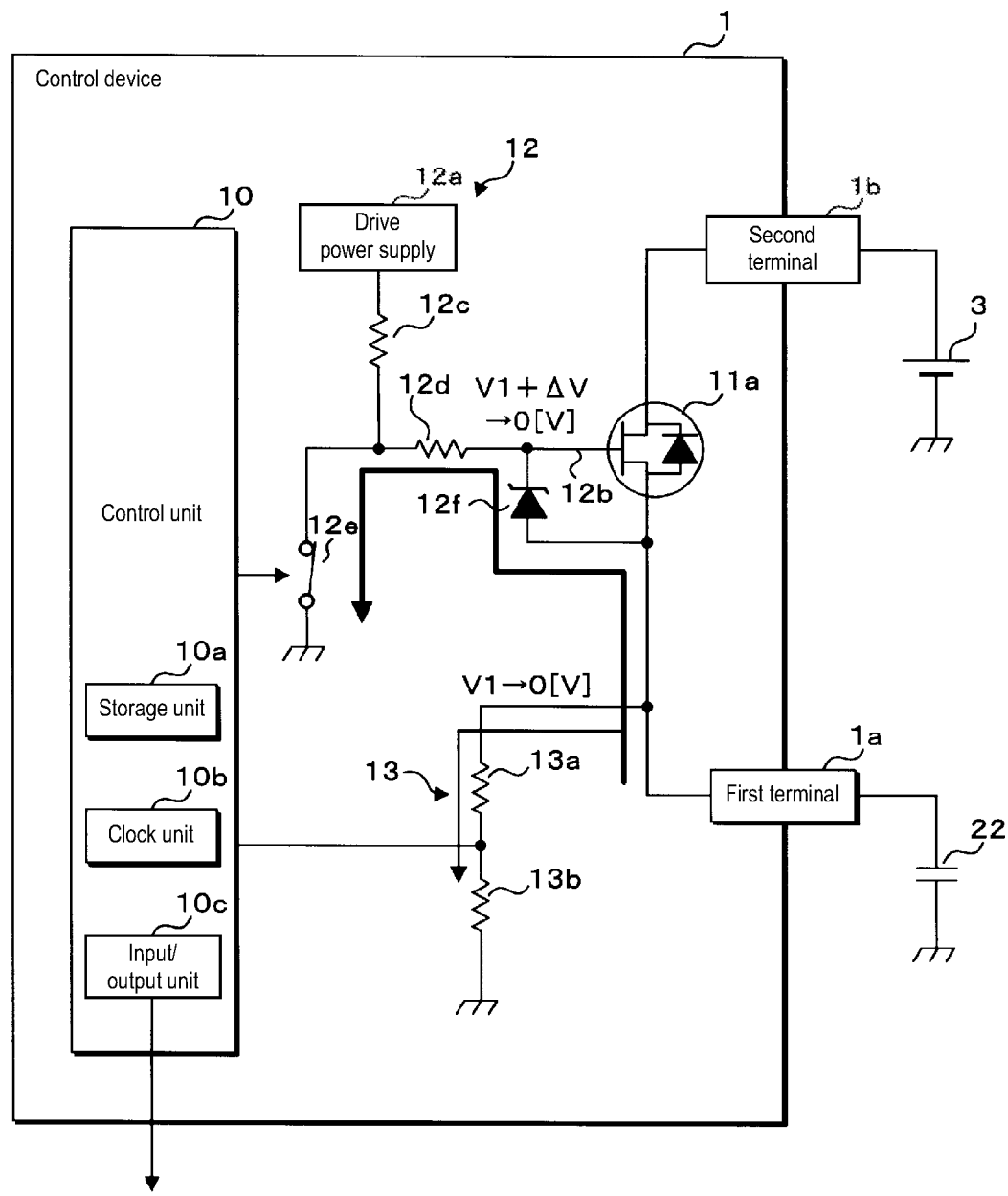
FIG. 4 is a diagram illustrating how a defect is determined.
Figure 5:
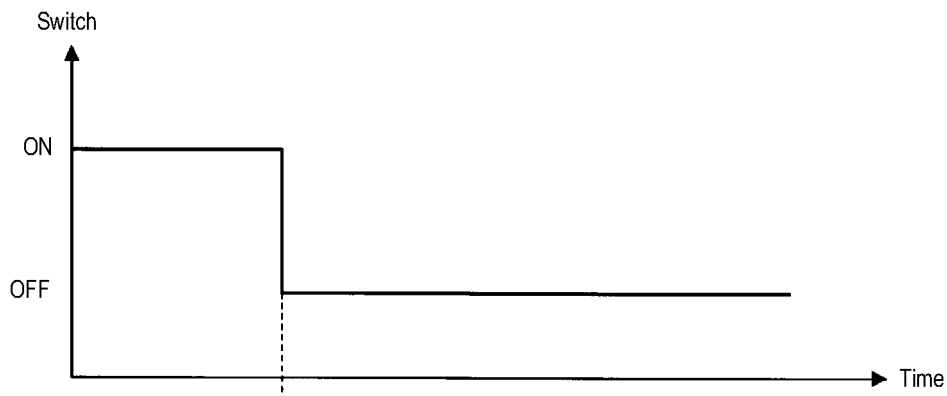
FIG. 5 is a timing chart illustrating how a short-circuit defect is diagnosed.
Figure 5:
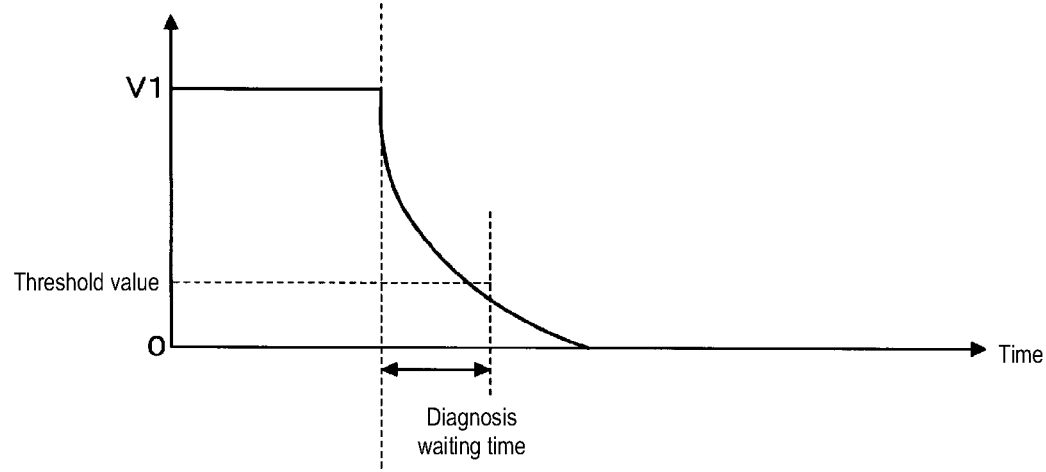
Figure 5:
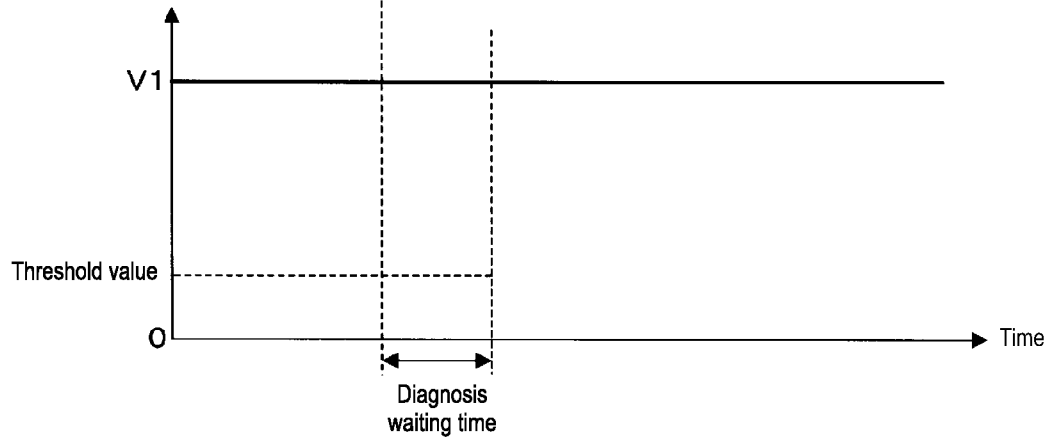

FIGS. 3 and 4 are diagrams illustrating how a defect is determined, and FIG. 5 is a timing chart illustrating how a short-circuit defect is diagnosed. The horizontal axis in FIG. 5 represents time. The vertical axis in FIG. 5A indicates the ON/OFF state of the semiconductor switch 11a. The vertical axis in FIG. 5B indicates the temporal change of the voltage VBATT of the first terminal 1a that is detected by the voltage detection unit 13 when the semiconductor switch 11a is not broken. The vertical axis of FIG. 5C indicates the temporal change of the voltage VBATT of the first terminal 1a that is detected by the voltage detection unit 13 when the semiconductor switch 11a has a short-circuit defect. When the semiconductor switch 11a has a short-circuit defect, the semiconductor switch 11a is always in the ON state, regardless of the voltage applied to the gate of the semiconductor switch 11a. In FIGS. 5B and 5C, a voltage V1 indicates a predetermined voltage of the on-board battery 3. The predetermined voltage is a rated voltage, and is a constant that does not change depending on the state of the on-board battery 3.

When the semiconductor switch 11a is in the ON state, as shown in FIG. 3, the voltage at the first terminal 1a is the predetermined voltage V1 of the on-board battery 3, and the voltage of the capacitor 22 is also the voltage V1. In FIGS. 3 and 4, ΔV denotes a gate-source voltage of the semiconductor switch 11a. The gate voltage of the semiconductor switch 11a is represented by V1+ΔV.

In the case where the semiconductor switch 11a is not broken, when the semiconductor switch 11a is turned from ON to OFF, as shown in FIG. 4, the capacitor 22 is discharged (refer to the white arrow in FIG. 1, and the thick arrow and the thin arrow in FIG. 4), and as shown in FIG. 5B, the voltage VBATT of the first terminal 1a decreases exponentially. To be more specific, as indicated by the thick arrow in FIG. 4, the electric charge accumulated in the capacitor 22 is discharged mainly through the Zener diode 12f, the second electric resistor 12d, and the drive switch 12e. In addition, as indicated by the thin arrow in FIG. 4, part of the electric charge accumulated in the capacitor 22 is discharged through the voltage dividing resistors 13a and 13b of the voltage detection unit 13. Finally, the voltage at the first terminal 1a and the gate voltage of the semiconductor switch 11a become zero volts.

When the semiconductor switch 11a has a short-circuit defect, the semiconductor switch 11a is always in the ON state, and the voltage VBATT of the first terminal 1a remains at the voltage V1 as shown in FIG. 5C.

The storage unit 10a of the control unit 10 stores a threshold value for determining whether or not the semiconductor switch 11a is defective and a diagnosis waiting time. The diagnosis waiting time is a time required for discharging the capacitor 22 that is charged by the on-board battery 3. The threshold voltage is a maximum voltage VBATT of the first terminal 1a when a predetermined diagnosis waiting time elapses after fully-charged capacitor 22 starts discharging.

The control unit 10 controls the semiconductor switch 11a from ON to OFF, and compares the voltage VBATT of the first terminal 1a at the time when the diagnosis waiting time has elapsed after the semiconductor switch is controlled from ON to OFF with the threshold value, thereby determining whether or not the semiconductor switch 11a has a short circuit defect. To be specific, when the voltage VBATT of the first terminal 1a after the elapse of the diagnosis waiting time is lower than the threshold value, the control unit 10 determines that the semiconductor switch 11a is not defective. To be specific, when the voltage VBATT of the first terminal 1a after the elapse of the diagnosis waiting time is higher than or equal to the threshold value, the control unit 10 determines that the semiconductor switch 11a is defective.

Figure 6:
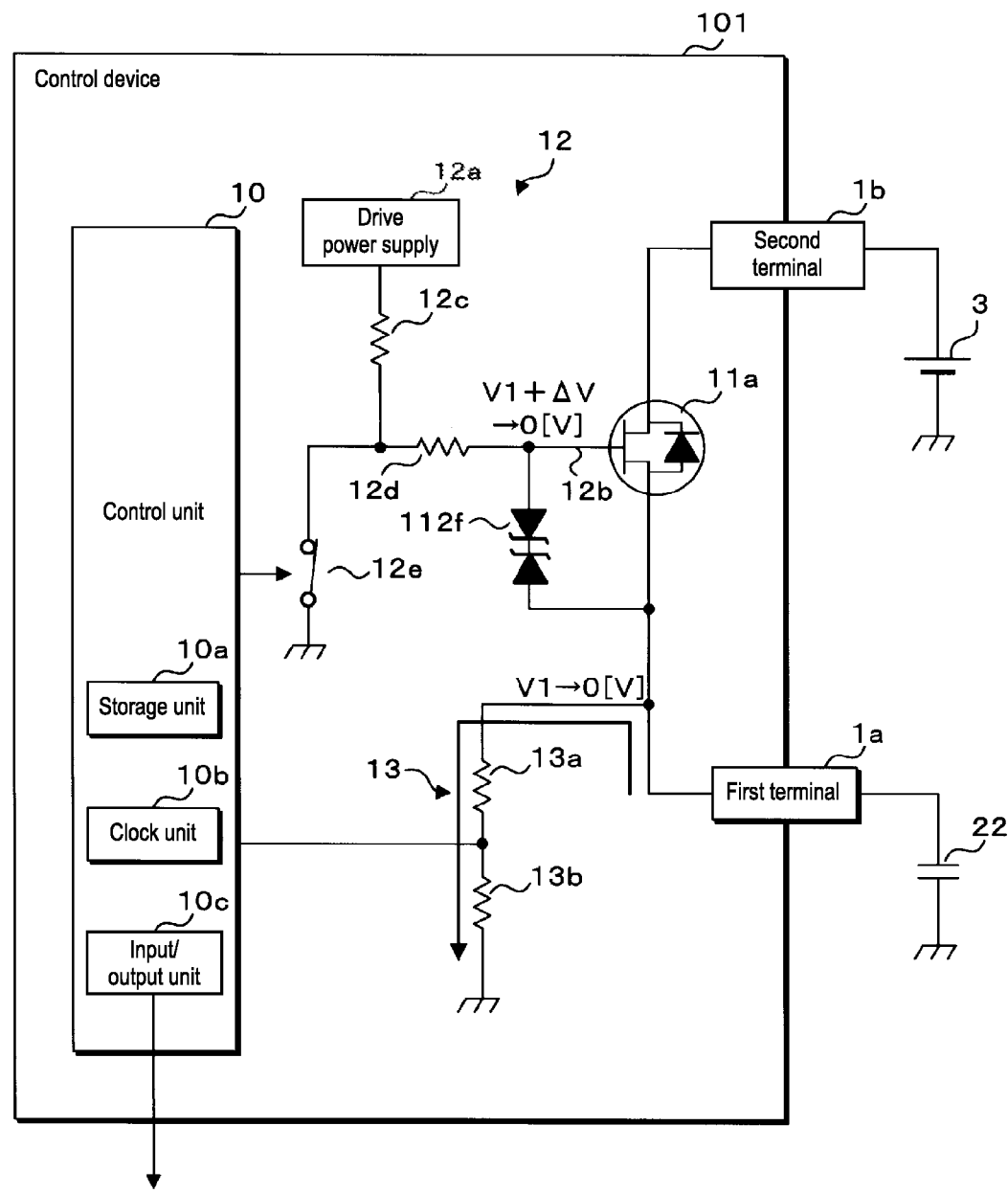
FIG. 6 is a block diagram illustrating a configuration example of a control device according to a comparative example.

FIG. 6 is a block diagram illustrating a configuration example of a control device 101 according to a comparative example. The control device 101 according to the comparative example includes a varistor 112f, instead of the Zener diode 12f included in the control device 1 according to the first embodiment.

Figure 7A:
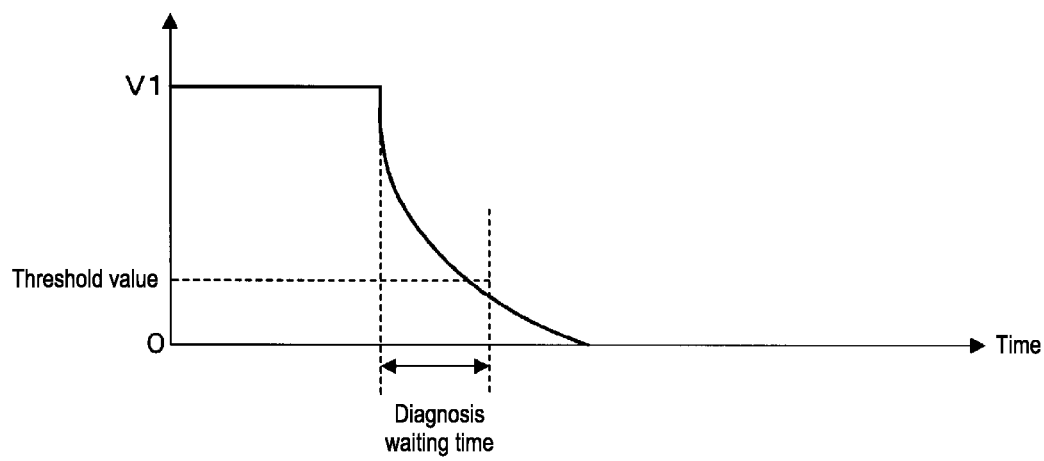
FIG. 7A is a timing chart illustrating an effect of the control device according to the first embodiment.
Figure 7B:
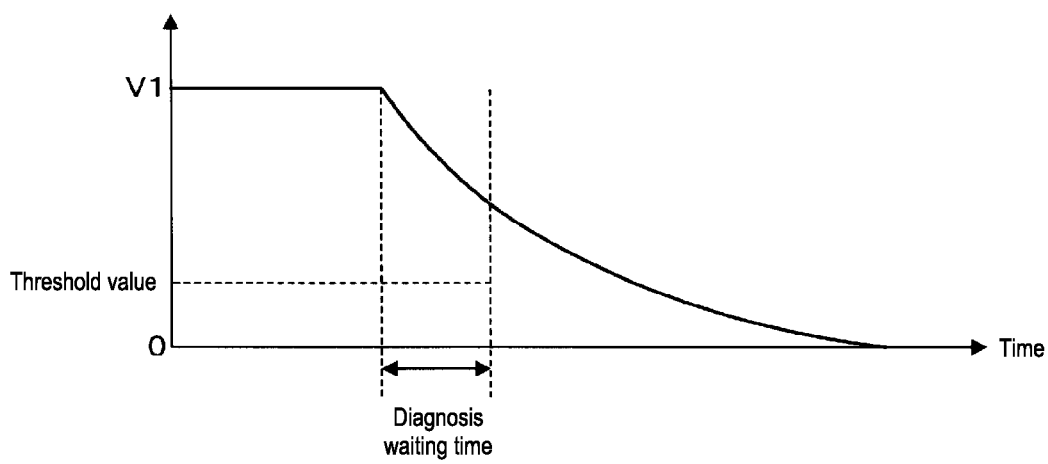
FIG. 7B is a timing chart illustrating an effect of the control device according to the first embodiment.

FIGS. 7A and 7B are timing charts showing effects of the control device 1 according to the first embodiment. The horizontal axis in FIGS. 7A and 7B represents time. The vertical axis in FIG. 7A indicates the temporal change of the voltage VBATT of the first terminal 1a that is detected by the voltage detection unit 13 of the control device 1 according to the first embodiment when the semiconductor switch 11a is not broken. The vertical axis in FIG. 7B indicates the temporal change of the voltage VBATT of the first terminal 1a that is detected by the voltage detection unit 13 of the control device 101 according to the comparative example when the semiconductor switch 11a is not broken.

In the control device 101 according to the comparative example, as shown in FIGS. 6 and 7B, the discharge path of the capacitor 22 is only the voltage detection unit 13. The control device 101 according to the comparative example requires more time to discharge the capacitor 22 than the control device 1 according to the first embodiment. Accordingly, the control unit 10 according to the comparative example requires more time to defect diagnosis of the switching circuit 11.

On the other hand, according to the first embodiment, as shown in FIGS. 4 and 7A, the electric charge accumulated in the capacitor 22 is discharged not only from the voltage detection unit 13, but also from the drive circuit 12. As a result, the capacitor 22 is discharged in a shorter time than in the comparative example. Therefore, the control unit 10 can perform defect diagnosis of the switching circuit 11 in a shorter time.

According to the control device 1 of the first embodiment configured as described above, when the capacitor 22 of the starter generator 2 whose opening and closing is controlled is connected, it is possible to efficiently discharge the capacitor 22 and determine in a short time whether or not the switching circuit 11 is defective.

According to the control device 1 of the first embodiment, the electric charge of the capacitor 22 can be discharged through the voltage detection unit 13, in addition to the drive circuit 12. As a result, the capacitor 22 can be discharged in a shorter time. Therefore, the control unit 10 can determine in a short time whether or not the switching circuit 11 is defective.

Further, because the control device 1 of the first embodiment includes the second electric resistor 12d, it is possible to reduce a surge voltage applied from the outside to the control unit 10 and a surge current flowing from the outside to the control unit 10.

Second Embodiment

A control device 201 according to a second embodiment is different from the first embodiment in that the control device 201 further includes a discharge circuit 14. Accordingly, the following mainly describes this difference. Because the other steps and effects are the same as those of the first embodiment, the portions corresponding to the first embodiment are denoted by the same reference numerals, and detailed description thereof will be omitted.

Figure 8:
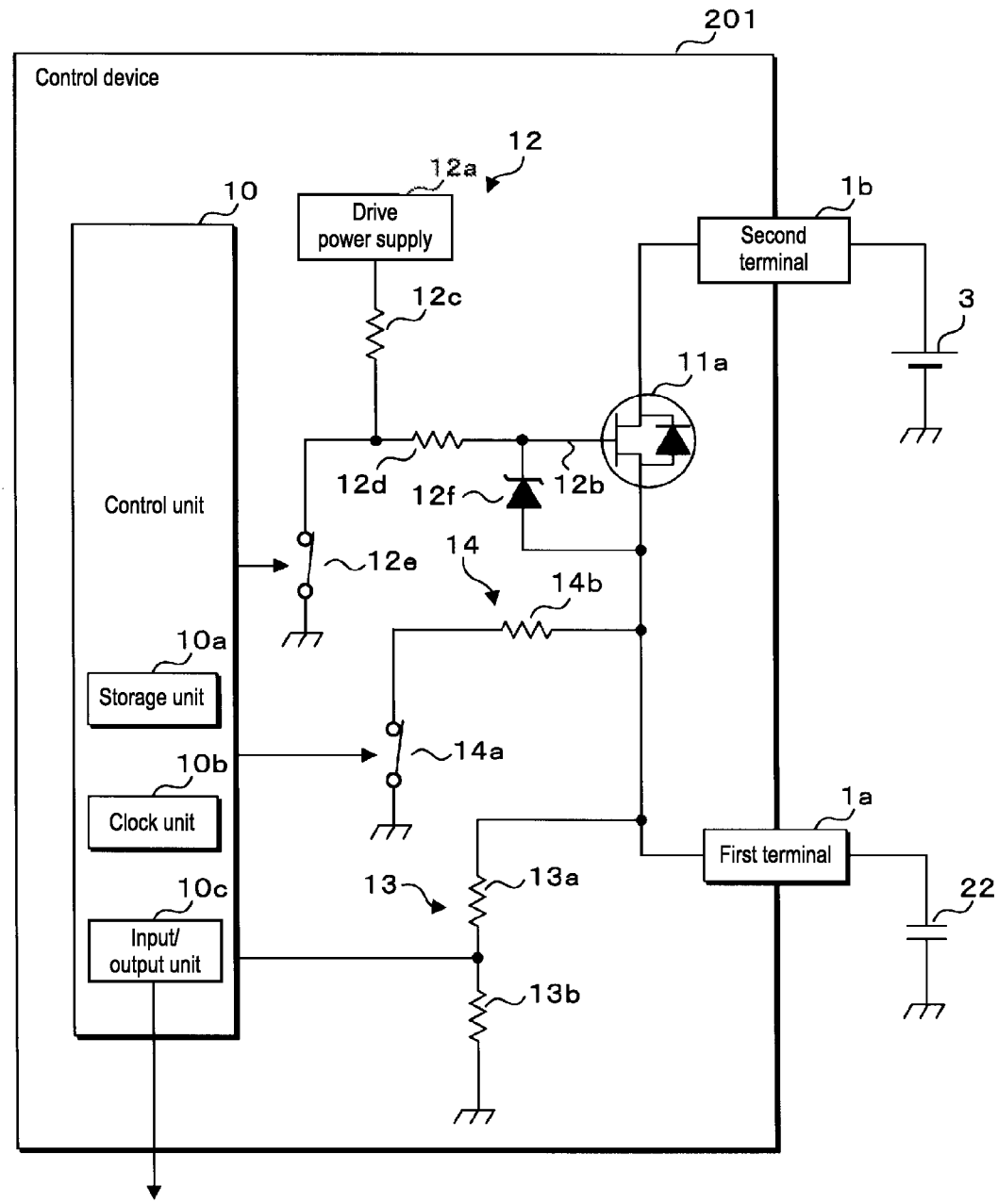
FIG. 8 is a block diagram illustrating a configuration example of a control device according to a second embodiment.

FIG. 8 is a block diagram illustrating a configuration example of the control device 201 according to the second embodiment. The control device 201 according to the second embodiment includes components similar to those of the control device 1 according to the first embodiment, and further includes the discharge circuit 14 that discharges the capacitor 22.

The discharge circuit 14 includes a discharge switch 14a for grounding one end of the semiconductor switch 11a, and a third electric resistor 14b. One end of the discharge switch 14a is grounded, and the other end of the discharge switch 14a is connected to one end of the third electric resistor 14b. The other end of the third electric resistor 14b is connected to the one end of the switch 11a. The operation of the discharge switch 14a is controlled by the control unit 10.

The control unit 10 turns the drive switch 12e and the discharge switch 14a ON and OFF. The control unit 10 controls, for example, the drive switch 12e from OFF to ON, and simultaneously controls the discharge switch 14a from OFF to ON. In this case, the semiconductor switch 11a is switched from ON to OFF, and the capacitor 22 starts discharging. The electric charge of the capacitor 22 is discharged through three discharge paths. The first discharge path is the drive circuit 12, the second discharge path is the voltage detection unit 13, and the third discharge path is the discharge circuit 14.

FIG. 8 shows an example in which the control unit 10 outputs control signals to the drive switch 12e and the discharge switch 14a separately. However, the same control signal may also be used for the drive switch 12e and the discharge switch 14a. In other words, a signal output from the control unit 10 may also be input to both the drive switch 12e and the discharge switch 14a.

According to the control device 201 of the second embodiment, the capacitor 22 can be discharged more efficiently than in the first embodiment, and it can be determined in a shorter time whether or not the switching circuit 11 is defective.

Third Embodiment

A control device 301 according to a third embodiment is different from the control device 1 according to the first embodiment in that a plurality of semiconductor switches 11a connected in parallel are provided, and Zener diodes 12f, electric resistors 12d, and drive switches 12e are provided in the plurality of semiconductor switches 11a respectively. Hereinafter, mainly this difference will be described. Because the other steps and effects are the same as those of the first embodiment, the portions corresponding to the first embodiment are denoted by the same reference numerals, and detailed description thereof will be omitted.

Figure 9:
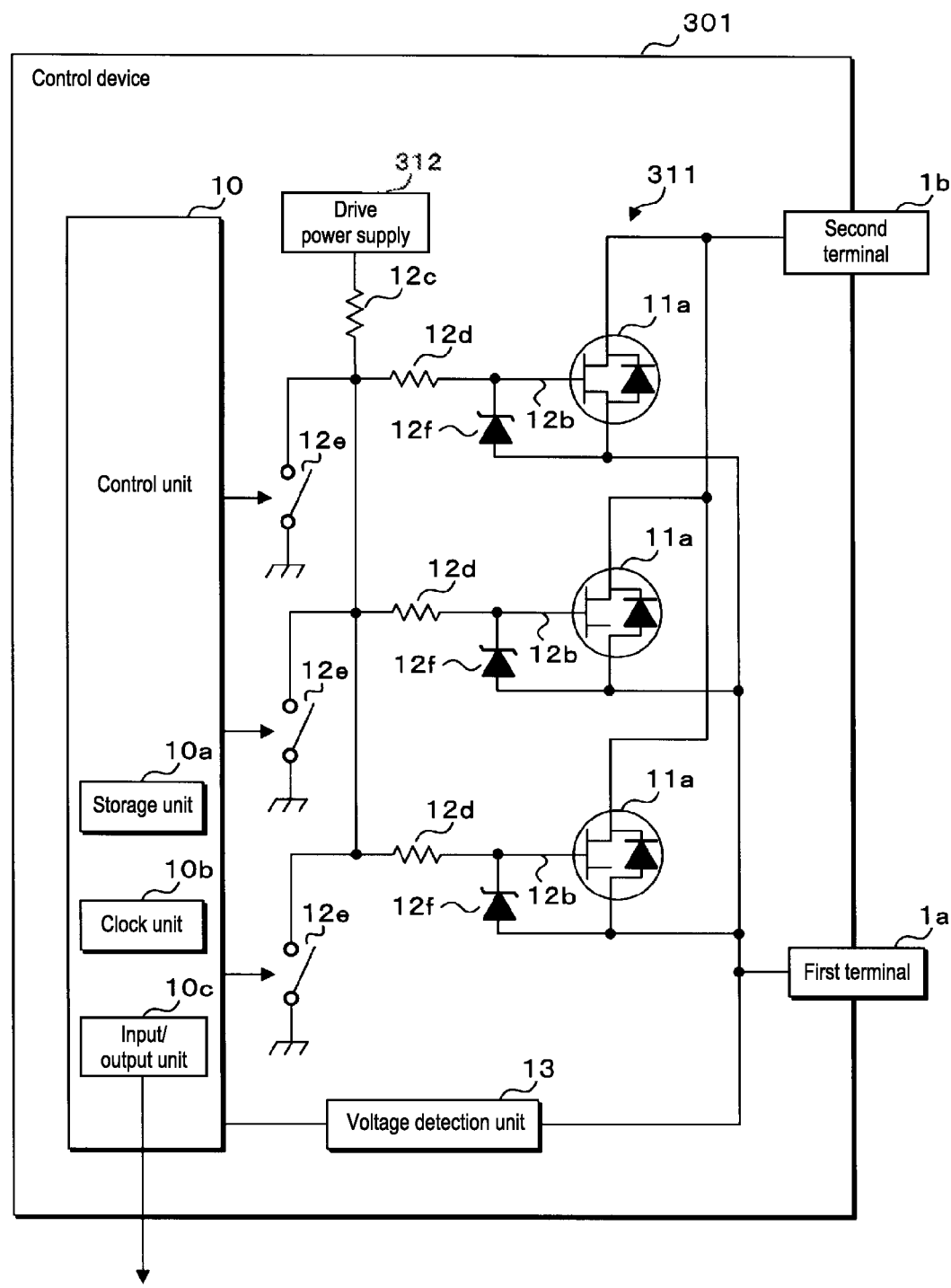
FIG. 9 is a block diagram illustrating a configuration example of a control device according to a third embodiment.

FIG. 9 is a block diagram illustrating a configuration example of the control device 301 according to the third embodiment. The control device 301 according to the third embodiment includes the plurality of semiconductor switches 11a connected in parallel. Although a switching circuit 311 in which three semiconductor switches 11a are connected in parallel will be described in the third embodiment, the number of the semiconductor switches 11a is not particularly limited to three.

The drive circuit 312 is a circuit for turning ON/OFF the plurality of semiconductor switches 11a, and the operation of the drive circuit 312 is controlled by the control unit 10. The drive circuit 312 includes a drive power supply 12a and a first electric resistor 12c. The drive circuit 312 includes wirings 12b that connect the drive power supply 12a and the gates of the plurality of semiconductor switches 11a, respectively. The drive circuit 312 includes a second electric resistor 12d, a drive switch 12e, and a Zener diode 12f for each of the plurality of semiconductor switches 11a.

In each of the plurality semiconductor switches 11a, the drive power supply 12a is connected, via the wiring 12b and the first electric resistor 12c and the second electric resistor 12d connected in series, to the gate of the semiconductor switch 11a. The wirings 12b are conductive lines for connecting the drive power supply 12a and the gates of the plurality of semiconductor switches 11a, respectively.

In each of the plurality of drive switches 12e, one end of the drive switch 12e is grounded, and the other end of the drive switch 12e is connected through the wiring 12b to the other end of the first electric resistor 12c related to the semiconductor switch 11a, and one end of the second electric resistor 12d.

According to the control device 301 of the third embodiment, the switching circuit 311 includes the plurality of semiconductor switches 11a connected in parallel. Accordingly, the control device 301 can open and close a circuit through which a large current that cannot be controlled by one semiconductor switch 11a flows.

In addition, the electric charge accumulated in the capacitor 22 is discharged through the plurality of Zener diodes 12f, the wirings 12b, and the drive switches 12e. Accordingly, the capacitor 22 can be discharged in a shorter time. Therefore, the control unit 10 can determine in a short time whether or not the switching circuit 311 is defective.

In addition, the second electric resistor 12d is provided in each of the plurality of semiconductor switches 11a. As a result, it is more effectively reduce a surge voltage applied to the control unit 10 and a surge current flowing into the control unit 10. The second electric resistor 12d provided in each semiconductor switch 11a can be miniaturized.

The configuration according to the third embodiment may also be applied to the second embodiment. In other words, the control device 301 according to the third embodiment may also include the discharge circuit 14 according to the second embodiment.

The invention claimed is:
1. A control device for a vehicle, comprising a switching circuit having a semiconductor switch, and being configured to open and close a connection between a starter generator having a capacitor connected to one end of the switching circuit, and an on-board battery and a load that are connected to another end of the switching circuit by turning ON/OFF the switching circuit, for preventing a voltage drop on the load side at the time of start of an engine by the starter generator, the control device further comprising:
   a drive power supply configured to output a drive voltage for turning ON/OFF the semiconductor switch;
   a wiring that connects the drive power supply and a gate of the semiconductor switch, in order to apply the drive voltage to the gate of the semiconductor switch;
   a first electric resistor having one end connected to the drive power supply through the wiring;
   a second electric resistor having one end connected to another end of the first electric resistor, and anther end connected to the gate of the semiconductor switch through the wiring;
   a drive switch having one end that is grounded and another end connected to the one end of the second electric resistor and the capacitor, and being provided for turning OFF the semiconductor switch by short-circuiting the wiring wherein the capacitor is discharged to ground, and turning ON the semiconductor switch when open so as to allow drive power supply to output a drive voltage to the semiconductor switch, wherein the capacitor is charged by the battery;
   a Zener diode having an anode connected to the one end of the switching circuit, and a cathode connected to the other end of the second electric resistor;
   a voltage detection unit configured to detect a voltage at the one end of the switching circuit; and
   a control unit configured to control the drive switch from OFF to ON, and determine whether or not the switching circuit is defective by comparing the voltage detected by the voltage detection unit with a predetermined threshold value, wherein a defect is determined when the voltage detected by the voltage detection unit is greater than the predetermined threshold.

2. The control device according to claim 1, wherein the voltage detection unit includes voltage dividing resistors that divide a voltage at the one end of the switching circuit.

3. The control device according to claim 1, further comprising:
   a discharge switch for grounding the one end of the switching circuit,
   wherein the control unit controls the drive switch and the discharge switch from OFF to ON.

4. The control device according to claim 1, wherein the switching circuit includes a plurality of the semiconductor switches connected in parallel, and
   the control device includes a plurality of the Zener diodes and a plurality of the electric resistors respectively provided in the plurality of semiconductor switches.

5. The control device according to claim 2, further comprising:
 a discharge switch for grounding the one end of the switching circuit,
 wherein the control unit controls the drive switch and the discharge switch from OFF to ON.

6. The control device according to claim 2, wherein the switching circuit includes a plurality of the semiconductor switches connected in parallel, and
 the control device includes a plurality of the Zener diodes and a plurality of the electric resistors respectively provided in the plurality of semiconductor switches.

7. The control device according to claim 3, wherein the switching circuit includes a plurality of the semiconductor switches connected in parallel, and
 the control device includes a plurality of the Zener diodes and a plurality of the electric resistors respectively provided in the plurality of semiconductor switches.

* * * * *